United States Patent

[11] 3,582,939

[72] Inventor Douglas B. Campbell
Natick, Mass.
[21] Appl. No. 859,534
[22] Filed Sept. 19, 1969
[45] Patented June 1, 1971
[73] Assignee Honeywell Inc.
Continuation of application Ser. No. 531,089, Mar. 2, 1966, now abandoned.

[54] BIPOLAR DIGITAL-TO-ANALOG CONVERTER
3 Claims, 4 Drawing Figs.

[52] U.S. Cl. .......... 340/347DA
[51] Int. Cl. .......... H03k 13/02
[50] Field of Search .......... 340/347; 330/69

[56] References Cited
UNITED STATES PATENTS
2,685,084 7/1954 Lippel et al. .......... 340/347
2,896,031 7/1959 Young .......... 330/69X
OTHER REFERENCES
Burr-Brown, Handbook of Operational Amplifier Applications ©1963 pg. 16— 19

*Primary Examiner*—Daryl W. Cook
*Assistant Examiner*—Charles D. Miller
*Attorneys*—Fred Jacob and Leo Stanger

ABSTRACT: A digital-to-analog converter, having a single conversion network powered from a single source of reference voltage, applies the analog voltage from the conversion network to a resistor network feeding a differential amplifier. The sign portion of the input digital signal operates a switch connected with one amplifier input terminal to invert the amplifier output polarity for one polarity of input signals and thereby provide for conversion of both positive and negative input digital signals.

Douglas B. Campbell
Inventor
by Alfred H. Rosen
Thomas N. Tarrant
Attorneys

Douglas B. Campbell
Inventor
by Alfred H. Rosen
Thomas N. Tarrant
Attorneys

BIPOLAR DIGITAL-TO-ANALOG CONVERTER

This application is a continuation of application Ser. No. 531,089 filed Mar. 2, 1966.

This invention relates to digital-to-analog converters and in particular to bipolar converters having high accuracy at the zero crossover level.

Unipolar digital-to-analog converters are quite simple requiring only a single digital-to-analog resistor ladder network and a single voltage reference source. When bipolar operation is required, complexity is greatly increased usually with a loss in accuracy. Bipolar digital-to-analog resistor ladder networks commonly consist of two unipolar networks with separate reference sources. Other bipolar arrangements generally require two reference sources and are susceptible to inaccuracy caused by tracking error between the two sources. Many of the prior art bipolar digital-to-analog converters become increasingly inaccurate as the polarity crossover point is approached. This is frequently the level at which accuracy is most critical.

Now in accordance with the present invention I have found a means to provide bipolar digital-to-analog conversion with a single reference source and one digital-to-analog conversion network. Instead of the usual single input operational amplifier at the output of the conversion network, I use a difference amplifier. The output of the conversion network is connected to both difference amplifier inputs through isolating elements. For operation at one polarity, one of the amplifier inputs is effectively disconnected and the amplifier operates as a straightforward amplifier. For operation at the other polarity, both inputs are applied in a manner that reverses the amplifier output with respect to the signal source. Polarity control is effected through a switch responsive to signals from the digital control input. Thus it is an object of the invention to define a novel bipolar digital-to-analog converter.

It is a further object of the invention to define a bipolar digital-to-analog converter using one reference source.

It is still a further object of the invention to define a bipolar digital-to-analog converter using a single difference amplifier with switch-controlled inputs for providing a bipolar output from a single unipolar conversion network.

Further objects and features of the present invention will become apparent upon reading the following specification together with the drawings in which.

Figure 1:
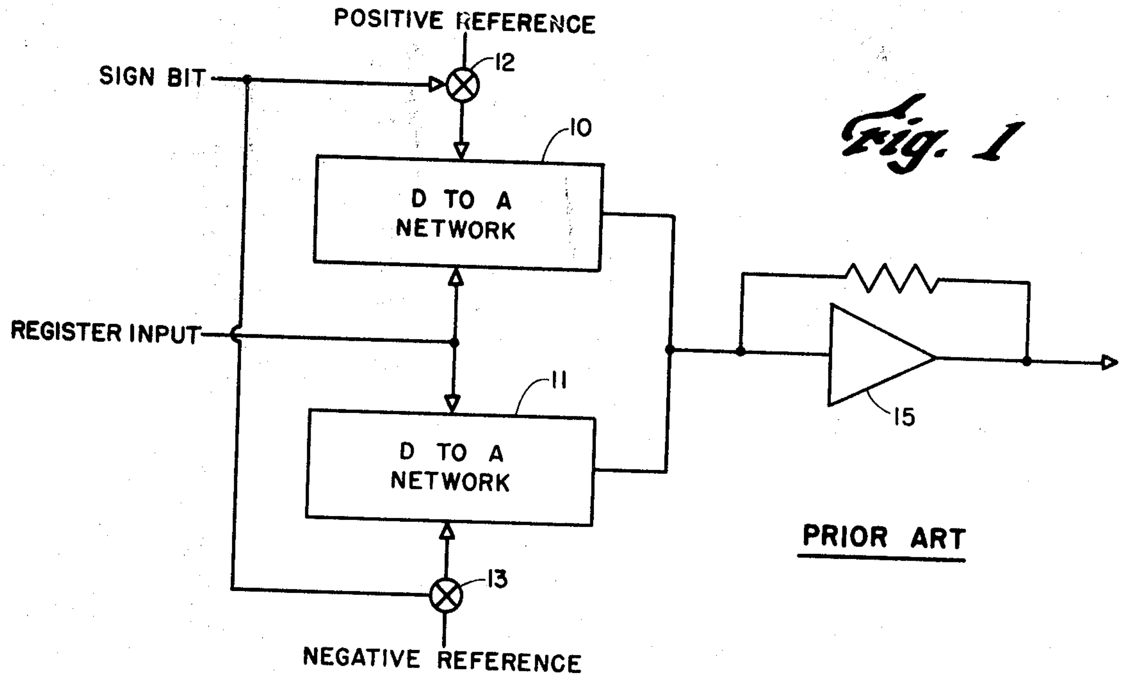
FIG. 1 is a circuit diagram of a prior art bipolar digital-to-analog converter.

FIG. 1 represents a typical prior art bipolar digital-to-analog converter arrangement. Two digital-to-analog networks 10 and 11 are used, one for each polarity. The required digital inputs are a "sign" bit and a digital register input. Networks 10 and 11 operate from reference sources of opposite polarity. The sign bit determines which network will be gated on by switches 12 and 13 in the reference source lines.

Each digital-to-analog network is suitably a resistive ladder network with switches which selectively connect one end of each resistor to either the reference source or ground. The other end of each resistor is connected in common with the remaining resistors to the input of operational amplifier 15. The switches for selectively connecting one end of each resistor to reference or to ground can be part of a digital register or operated by the output of such a register.

Since the ladder networks are only accurate when they have a constant load, an operational amplifier is used as an output buffer stage. The operational amplifier will be recognized as a very high gain amplifier with a negative feedback network which maintains the input voltage virtually constant providing a very high input impedance and very low output impedance. For descriptive purposes the operational amplifier is usually idealized as an amplifier of infinite gain, infinitely high input impedance, and infinitely low output impedance.

Figure 2:
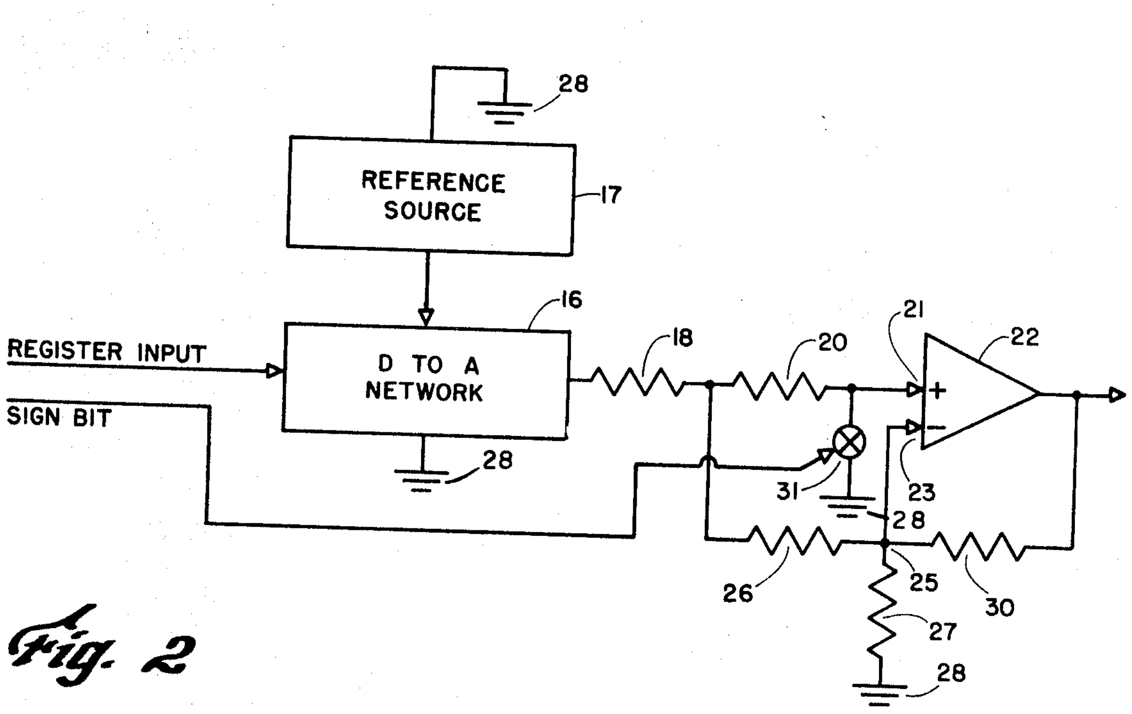
FIG. 2 is a circuit diagram of a bipolar digital-to-analog converter according to the invention.

FIG. 2 illustrates a general embodiment of the invention. A single unipolar digital-to-analog network 16 is shown supplied from a single reference source 17. Network 16 is suitably the same as network 10 described with relation to FIG. 1. The output of network 16 is fed through series resistors 18 and 20 to one input 21 of difference amplifier 22. A difference amplifier will be recognized as an amplifier that has two signal inputs and an output that is representative of the difference between the two inputs.

The second input 23 of amplifier 22 is connected to a junction 25. Junction 25 is connected by a resistor 26 to the common connection of resistors 18 and 20. Junction 25 is also connected through a resistor 27 to common ground 28 of source 17. A feedback resistor 30 is connected from the output of the difference amplifier to junction 25. Where the difference amplifier has a double ended output, the output, for purposes of the invention, is the one providing signal inversion with respect to input 23. A switch element 31 is connected between input 21 of amplifier 22 and common ground 28. Switch 31 is actuated by an input signal designated as a sign bit for determining polarity. As shown in FIG. 2 and as is conventional, common ground 28 serves as a return conductor between one side of the reference source 17, one side of the D-to-A network 16, one side of the switch 31, and one side of the resistor 27.

The function of the inventive circuit will be described in relation to FIGS. 3 and 4 which depict idealized equivalent circuits of the FIG. 2 circuit, with switch 31 closed for FIG. 3 and open for FIG. 4.

When switch 31 is closed input 21 of amplifier 22 is shorted to ground effectively disconnecting it as an input. In this condition amplifier 22 operates as an ordinary operational amplifier depicted by amplifier 35 in FIG. 3. The digital-to-analog network output voltage is indicated as signal source 36. Resistor 18 represents the output resistance of the network. Amplifier 35 functions as a conventional single ended operational amplifier with the common junction 25 being the virtual ground summing junction.

Considering amplifier 35 as an idealized amplifier, the feedback current through resistor 30 exactly equals the signal current through resistor 26. Thus there is no current flow through resistor 27 to ground and resistor 27 can be ignored. It will be seen that with no current through resistor 27, input 23 must be at virtual ground potential. The current through resistor 26 is $$\frac{E_s R_1}{R_1 R_2 + R_s(R_1 + R_2)}$$

where:

$R_s$ = resistor 18 (network output resistance)
$R_1$ = resistor 20
$R_2$ = resistor 26
$R_3$ = resistor 30
$E_s$ = full scale output of network 16

The full scale output ($E_0$) of amplifier 22 is $$E_0 = \frac{-R_1 R_3 E_s}{R_1 R_2 + R_s(R_1 + R_2)}$$

Figure 3:
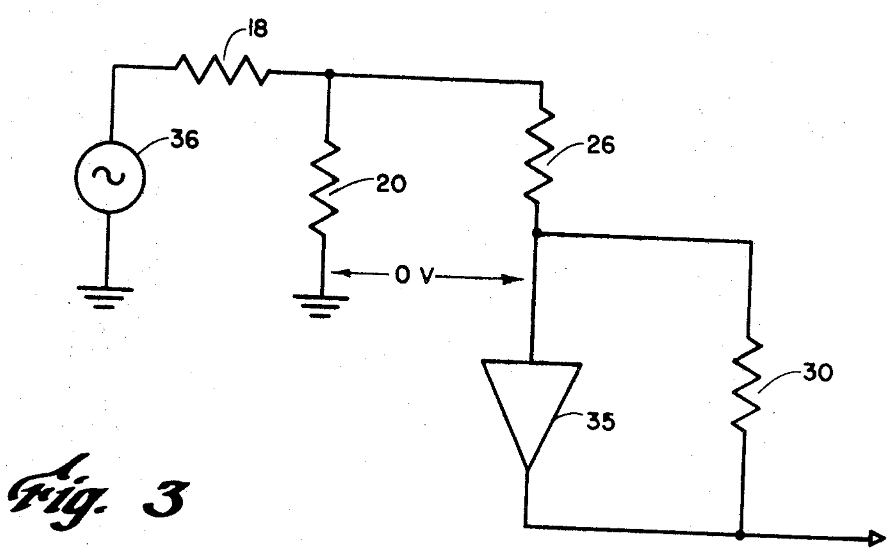
FIG. 3 is an equivalent circuit for one polarity of operation of the FIG. 2 circuit.

In the circuit of FIG. 3 as depicted, the output will always be inverted with respect to the signal source 36.

Referring back to FIG. 2, amplifier 22 is suitably operated with an output voltage reference that covers a range both positive and negative with respect to the no signal reference or common ground of network 16. Amplifier 22 can then have an output in its balanced condition (no signal) that equals the no signal reference of network 16. Under these circumstances a positive signal (with respect to common ground 28) from network 16 will always result in a negative signal at the output of amplifier 22 and vice versa.

For ease of description, the output no signal condition is given as common ground above and in the following description of FIG. 4. However it is to be understood that the output of amplifier 22 can readily be biased to a different reference potential in its no signal condition with respect to analog network 16. Thus the output "zero" could be, by way of example, plus 5 volts with respect to common ground 28.

Figure 4:
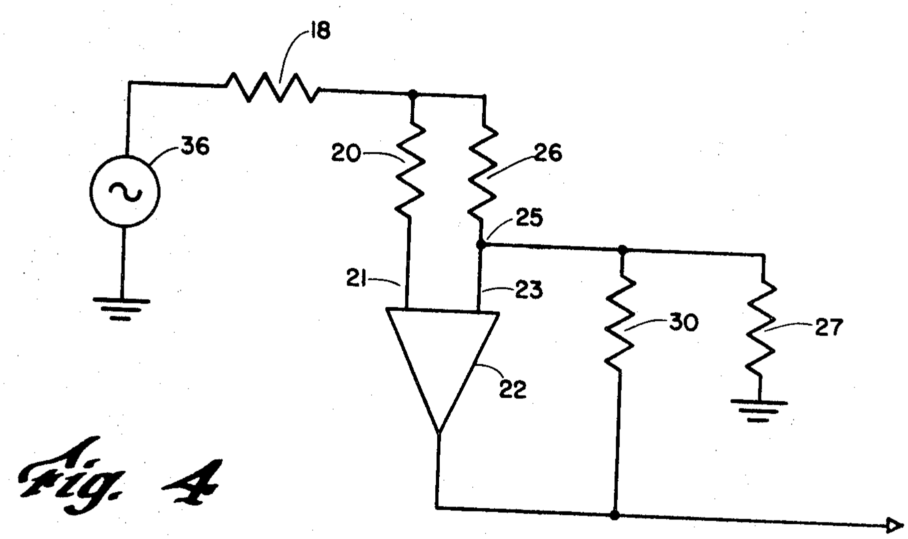
FIG. 4 is an equivalent circuit for the other polarity of operation of the FIG. 2 circuit.

Now considering the circuit of FIG. 2 with switch 31 open, the equivalent circuit is illustrated in FIG. 4 with both inputs 21 and 23 operative. A gain explanation will be in terms of an idealized amplifier with infinite gain, infinitely high input impedance, and infinitely low output impedance. In practice amplifier 22 is designed to approach this condition to the extent of accuracy required.

With infinite input impedance there is no signal voltage drop across resistor 20. Signal fed through resistor 30 to the inverting input 23 will provide a signal at input 23 that is equal to the signal at input 21. Thus the voltage at input 23 must equal the voltage at input 21. It then follows that since no voltage drop occurs across resistor 20, no voltage drop can occur across resistor 26. With no voltage drop, no current can flow through either of resistors 20 and 26. There is no other path to provide current through network output resistor 18 so there is no voltage drop across resistance 18 either.

It now becomes apparent that the full voltage from signal source 36 will appear across resistor 27 and the current through resistor 27 is supplied through feedback resistor 30. The output full scale voltage will then be $E_O=E_s(R_3/R_4+1)$ where:

$R_4$ = resistor 27

By correct choice of resistances the voltage magnitudes of one polarity of the output can be made to equal the voltage magnitudes of the opposite polarity. One way of calculating the proper resistances is to set the full scale magnitudes equal:

$$\frac{R_1R_3}{R_1R_2+R_s(R_1+R_2)}=\frac{R_3+R_4}{R_4}$$

The values of all resistances except resistor 27 ($R_4$) can be selected for optimum performance of the network and amplifier. The $R_4$ can be determined so that the full scale magnitudes will be equivalent:

$$R_4=\frac{R_3(R_1R_2+R_s[R_1+R_2])}{R_1R_3-R_1R_2-R_s(R_1+R_2)}$$

While idealized conditions have been described above, in practice it will be understood that output variation from amplifier 22 will result from difference variations in signals applied at inputs 21 and 23 no matter how infinitely small such variations may be. Thus the output of amplifier 22 will follow the analog network output polarity when input 21 follows the network voltage more closely than input 23. When input 23 follows the network polarity more closely then input 21, then the output of amplifier 22 will invert the network output polarity. Which of inputs 21 and 23 follows the network voltage more closely is determined by switch 31.

The digital-to-analog converter of the present invention can be used with a variety of different types of digital-to-analog networks and various forms of difference amplifiers. Preferably the difference amplifier should have good common mode rejection to prevent ambiguities in single ended output operation.

Switch 31 and resistor 20 can be interchanged or two switches may be used with the second switch replacing resistor 20. The embodiment shown in FIG. 2 is preferable since it uses only one switch and shunt switching is usually easier to achieve with minimum error contribution. Of course if the switching arrangement is changed from that illustrated in FIG. 2 there would be some modifications of the equations for the bipolar magnitudes.

While the invention has been described in relation to specific embodiments, various modifications thereof will be apparent to those skilled in the art and it is intended to cover the invention broadly within the spirit and scope of the appended claims.

I claim:

1. A bipolar digital-to-analog converter comprising
   A. a reference source having two terminals, one being designated common ground,
   B. a unipolar conversion means having
      1. a digital-to-analog network connected across said terminals of said reference source,
      2. an input to said network for digital information that is to be converted to an analog voltage, and
      3. an output terminal receiving from said network a voltage, with respect to common ground, which is the analog of digital information at said input to said network,
   C. a difference amplifier
      1. having first and second input terminals and an output terminal,
      2. having a feedback resistive element connected from said amplifier output terminal back to said second amplifier input terminal,
      3. providing, at said output terminal thereof, a voltage representative of the difference between the signals at said input terminals thereof, said voltage representing zero when the signals at said input terminals are balanced and shifting either positively or negatively depending on which of said input terminals is positive with respect to the other,
   D. means for providing two isolated output terminals of said conversion means and carrying signals of the same polarity, said means comprising
      1. a resistive network having
         a. a first resistive element connected between said network output terminal and said first amplifier input terminal,
         b. a second resistive element connected between said network terminal and said second amplifier input terminal, and
         c. a third resistive element connected between said second amplifier input terminal and said common ground, and
   E. switching means connected between said first amplifier input terminal and said common ground and having an input connection for selectively actuating said switching means in response to digital information,
      1. said switching means having at least two states and operative in one state to cause said first amplifier input terminal to follow a signal from said conversion means more closely than said second amplifier input terminal, and in the second state to cause said second amplifier input terminal to follow the signal from said conversion means more closely than said first amplifier input terminal, so that with said switch in one of said two states said difference amplifier provides at said output terminal thereon a voltage of the same polarity as said voltage from said conversion means and in the other of said two states said difference amplifier provides a voltage of the opposite polarity from said voltage from said conversion means.

2. A converter according to claim 1 in which said switching means is arranged as a shunt switch from said first amplifier input terminal to said common ground, and switches from one state to the other in response to a sign bit digital input signal.

3. A bipolar digital-to-analog converter according to claim 1 in which said switching means is operative to selectively short circuit said first input terminal to common ground.